United States Patent
Choi et al.

(10) Patent No.: US 8,134,152 B2
(45) Date of Patent: Mar. 13, 2012

(54) CMOS THIN FILM TRANSISTOR, METHOD OF FABRICATING THE SAME AND ORGANIC LIGHT EMITTING DISPLAY DEVICE HAVING LAMINATED PMOS POLY-SILICON THIN FILM TRANSISTOR WITH A TOP GATE CONFIGURATION AND A NMOS OXIDE THIN FILM TRANSISTOR WITH AN INVERTED STAGGERED BOTTOM GATE CONFIGURATION

(75) Inventors: Jong-Hyun Choi, Yongin (KR); Sung-Ho Kim, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 204 days.

(21) Appl. No.: 12/686,550

(22) Filed: Jan. 13, 2010

(65) Prior Publication Data
US 2010/0176395 A1 Jul. 15, 2010

(30) Foreign Application Priority Data

Jan. 13, 2009 (KR) .................. 10-2009-0002650

(51) Int. Cl.
*H01L 29/12* (2006.01)
(52) U.S. Cl. ........... 257/43; 257/66; 257/72; 257/E29.1; 257/E29.273; 257/E21.632; 257/340; 257/346; 438/199; 438/229; 438/299; 438/166
(58) Field of Classification Search .................. None
See application file for complete search history.

(56) References Cited

U.S. PATENT DOCUMENTS

| | | | |
|---|---|---|---|
| 6,307,322 B1 | 10/2001 | Dawson et al. | |
| 7,910,932 B2 * | 3/2011 | Marks et al. | 257/72 |
| 2007/0093007 A1 | 4/2007 | Deane | |
| 2007/0096100 A1 | 5/2007 | Lee et al. | |
| 2007/0187676 A1 | 8/2007 | Park et al. | |
| 2008/0179598 A1 | 7/2008 | Kim et al. | |

FOREIGN PATENT DOCUMENTS

| | | |
|---|---|---|
| JP | 2003-008027 | 1/2003 |
| KR | 1020050011602 | 1/2005 |
| KR | 100486717 B1 | 4/2005 |
| KR | 1020060075587 | 7/2006 |
| KR | 100655658 | 12/2006 |

(Continued)

OTHER PUBLICATIONS

Korean Office Action dated Oct. 18, 2010 issued by the KIPO, No. 10-2009-0002650 together with a Request for Entry.

(Continued)

*Primary Examiner* — Minhloan T Tran
*Assistant Examiner* — Fei Fei Yeung Lopez
(74) *Attorney, Agent, or Firm* — Robert E. Bushnell, Esq.

(57) ABSTRACT

A CMOS thin film transistor arrangement including a PMOS poly-silicon thin film transistor having a top gate configuration and a NMOS oxide thin film transistor having an inverted staggered bottom gate configuration where both transistors share the same gate electrode. The shared gate electrode is used as a doping or implantation mask in the formation of the source and drain regions of the poly-silicon transistor.

10 Claims, 6 Drawing Sheets

FOREIGN PATENT DOCUMENTS

| | | |
|---|---|---|
| KR | 20070003588 A | 1/2007 |
| KR | 1020070033070 | 3/2007 |
| KR | 1020080046508 A | 5/2008 |
| KR | 1020080073944 A | 8/2008 |
| KR | 1020090004944 | 1/2009 |

OTHER PUBLICATIONS

Korean Office Action dated Oct. 20, 2010 issued by the KIPO, No. 10-2009-0005528.

Korean Office Action issued by Korean Patent Office on Jun. 15, 2011, corresponding to Korean Application No. 10-2009-0005528 and Request for Entry Accompanying Office Action attached herewith.

Korean Office action issued by KIPO on Nov. 30, 2011, corresponding to Korean Patent Application No. 10-2009-0002650 and Request for Entry attached herewith.

* cited by examiner

CMOS THIN FILM TRANSISTOR, METHOD OF FABRICATING THE SAME AND ORGANIC LIGHT EMITTING DISPLAY DEVICE HAVING LAMINATED PMOS POLY-SILICON THIN FILM TRANSISTOR WITH A TOP GATE CONFIGURATION AND A NMOS OXIDE THIN FILM TRANSISTOR WITH AN INVERTED STAGGERED BOTTOM GATE CONFIGURATION

CLAIM OF PRIORITY

This application makes reference to, incorporates the same herein, and claims all benefits accruing under 35 U.S.C. §119 from an application earlier filed in the Korean intellectual Property Office on 13 Jan. 2009 and there duly assigned Serial No 10-2009-0002650.

BACKGROUND OF THE INVENTION

1. Field of the Invention

The present invention relates to a CMOS (complimentary metal oxide semiconductor) thin film transistor arrangement implemented by laminating a PMOS poly-silicon thin film transistor and an NMOS oxide thin film transistor, a method of manufacturing the same and an organic light emitting display device having the same.

2. Discussion of Related Art

A CMOS thin film transistor arrangement includes a PMOS thin film transistor and an NMOS thin film transistor, and can implement various circuits and a system that are difficult to be implemented by only PMOS thin film transistors or only NMOS thin film transistors. However, since the PMOS thin film transistor and the NMOS thin film transistor are required to be arranged on a single substrate in order to implement the CMOS thin film transistor arrangement, CMOS technology requires relatively many processes.

Moreover, the PMOS thin film transistor and the NMOS thin film transistor which make up the CMOS thin film transistor arrangement includes an active layer providing a channel region, a source region, and a drain region, and a gate electrode electrically insulated from the active layer by a gate insulating layer. The active layers of the thin film transistors are generally made out of a semiconductor layer such as amorphous silicon or poly-silicon.

When the active layer is made out of amorphous silicon, mobility is low so that it is difficult to implement a driving circuit driven at high speed. On the contrary, when the active layer is made out of poly-silicon, the mobility is high but threshold voltage is not uniform due to polycrystalline nature, so that a compensation circuit is required to compensate scattering of the threshold voltage. In addition, the mobility and yield are low when a poly-silicon active layer is used. Furthermore, the number of masks is higher for the poly-silicon active layer than for the amorphous silicon active layer due to a coplanar configuration, so that manufacturing costs are increased.

Therefore, in order to implement a CMOS thin film transistor arrangement, there is a need for simplify the manufacturing process while providing a satisfactory electrical performance.

SUMMARY OF THE INVENTION

Therefore, the present invention is made in view of the above problems and provides a CMOS thin film transistor arrangement which is implemented by laminating a PMOS poly-silicon thin film transistor with a top gate configuration and an NMOS oxide thin film transistor with an inverted staggered bottom gate configuration and in which electrical performance is maintained and manufacturing process is simplified, a method of manufacturing the same, and an organic light emitting display device having the CMOS thin film transistor arrangement.

According to the aspect of the present invention, there is provided a CMOS thin film transistor arrangement that includes a substrate, a poly-silicon layer arranged on the substrate, the poly-silicon layer having source and drain regions separated by a channel region at a center portion of the poly-silicon layer, the poly-silicon layer being P-type, a gate insulating layer arranged on the poly-silicon layer, a gate electrode arranged on a portion of the gate insulating layer that corresponds to the channel region of the poly-silicon layer, an intermediate insulating layer arranged on the gate electrode and on the gate insulating layer, an oxide semiconductor layer arranged on a portion of the intermediate insulating layer that corresponds to the gate electrode, a passivation layer arranged on the oxide semiconductor layer to entirely cover the oxide semiconductor layer, the passivation layer being perforated by a plurality of apertures, first source and drain electrodes arranged on the passivation layer and contacting the source and drain regions respectively of the poly-silicon layer via ones of the apertures and second source and drain electrodes arranged on the passivation layer and contacting portions of the oxide semiconductor layer via ones of said apertures.

The CMOS thin film transistor arrangement can also include a PMOS poly-silicon thin film transistor with a top gate configuration, wherein the PMOS poly-silicon thin film transistor includes the poly-silicon layer, the gate electrode and the first source and drain electrodes. The CMOS thin film transistor arrangement can also include an NMOS oxide thin film transistor having an inverted staggered bottom gate configuration, wherein the NMOS oxide thin film transistor includes the gate electrode, the oxide semiconductor layer and the second source and drain electrodes. The oxide semiconductor layer can include a lower layer having a carrier concentration of $10^{15}$ to $10^{17}/cm^3$ and an upper layer having a carrier concentration of $10^{12}$ to $10^{15}/cm^3$.

According to another aspect of the present invention, there is provided a method of manufacturing a CMOS thin film transistor arrangement, including forming a buffer layer on a substrate, forming a poly-silicon layer on the buffer layer, the poly-silicon layer being an active layer of a first thin film transistor, forming a gate insulating layer on the poly-silicon layer, forming a gate electrode on the gate insulating layer, producing a source region, a drain region and a channel region of the first thin film transistor in the poly-silicon layer by injecting P+ impurities into portions of the poly-silicon layer that are not covered by the gate electrode, the gate electrode serving as a mask during said injecting, forming an intermediate insulating layer on an entire surface of the gate electrode and on exposed portions of the gate insulating layer, forming an oxide semiconductor layer on a portion of the intermediate insulating layer that overlaps the gate electrode, the oxide semiconductor layer being an active layer of a second thin film transistor, forming a passivation layer on the oxide semiconductor layer, the passivation layer being perforated by a plurality of apertures and forming first source and drain electrodes and second source and drain electrodes on the passivation layer and in the apertures in the passivation layer, the first source and drain electrodes being in contact with the source and drain regions respectively of the poly-silicon layer and the second source and drain electrodes being in contact with portions of the oxide semiconductor layer. The first thin film transistor can be a PMOS poly-silicon thin film transistor having a top gate configuration. The second thin film transistor is an NMOS oxide thin film transistor having an inverted staggered bottom gate configuration.

According to yet another aspect of the present invention, there is provided an organic light emitting display device that includes a plurality of data lines intersecting a plurality of scanning lines, a plurality of pixels, each of said pixels being arranged at an intersection of one of said data lines and one of said scanning lines, each of said pixels including a plurality of thin film transistors and an organic light emitting device, a scan driving unit including a plurality of thin film transistors, the scan driving unit to supply scanning signals to the plurality of scanning lines and a data driving unit including a plurality of thin film transistors, the data driving unit to supply data signals to the plurality of data lines, wherein the plurality of thin film transistors in the scan driving unit and the in data driving unit each include a CMOS thin film transistor arrangement, each CMOS thin film transistor arrangement can include a substrate, a poly-silicon layer arranged on the substrate, the poly-silicon layer having source and drain regions separated by a channel region at a center portion of the poly-silicon layer, the poly-silicon layer being P-type, a gate insulating layer arranged on the poly-silicon layer, a gate electrode arranged on a portion of the gate insulating layer that corresponds to the channel region of the poly-silicon layer, an intermediate insulating layer arranged on the gate electrode and on the gate insulating layer, an oxide semiconductor layer arranged on a portion of the intermediate insulating layer that corresponds to the gate electrode, a passivation layer arranged on the oxide semiconductor layer to entirely cover the oxide semiconductor layer, the passivation layer being perforated by a plurality of apertures, first source and drain electrodes arranged on the passivation layer and contacting the source and drain regions respectively of the poly-silicon layer via ones of the apertures and second source and drain electrodes arranged on the passivation layer and contacting portions of the oxide semiconductor layer via ones of said apertures. The CMOS thin film transistor arrangement can be one of an inverter and a buffer device for at least one of the scan driving unit and the data driving unit.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

Figure 1A:
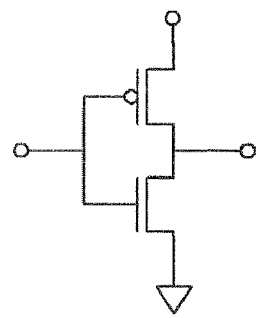
FIGS. 1A to 1G are illustrative circuit diagrams of CMOS thin film transistor arrangements that the embodiments of the present invention applies.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the principles for the present invention.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present.

In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

Turning now to FIGS. 1A to 1G, FIGS. 1A to 1G are illustrative circuit diagrams of CMOS thin film transistor arrangement that the present invention is applied. A CMOS thin film transistor arrangement is widely used to process digital signals and/or store data. For example, the CMOS thin film transistor arrangement is widely applied to implement a logic circuit, a BiCMOS circuit implemented with a high frequency active bipolar transistor, a complete CMOS type SRAM cell circuit, and the like, and the circuits to which the CMOS thin film transistor arrangement are applied are illustrated in FIGS. 1A to 1G.

Figure 1B:
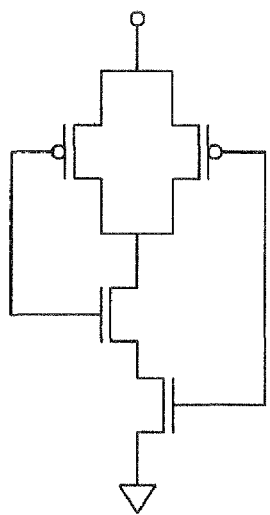
Figure 1C:
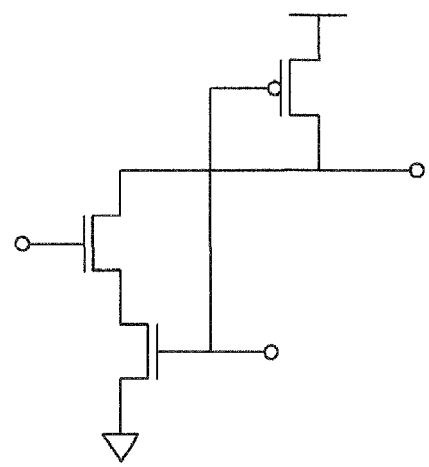
Figure 1D:
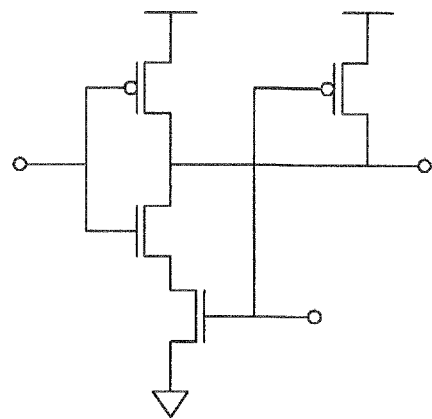
Figure 1E:
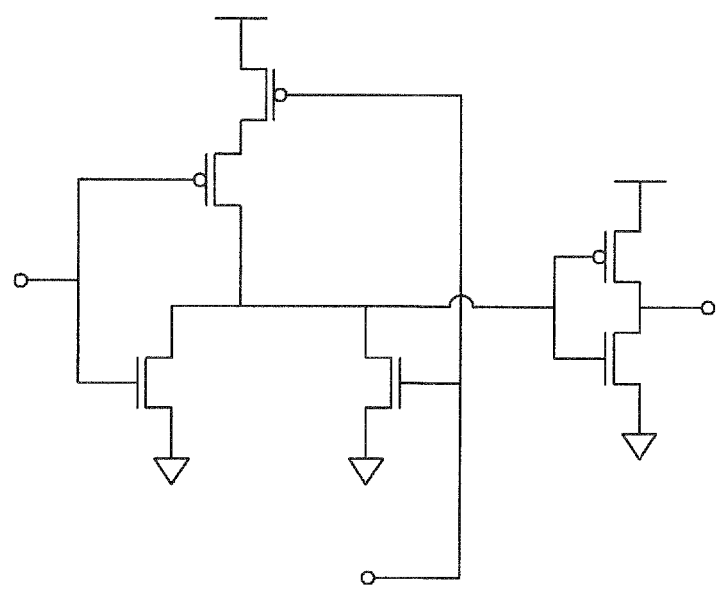
Figure 1F:
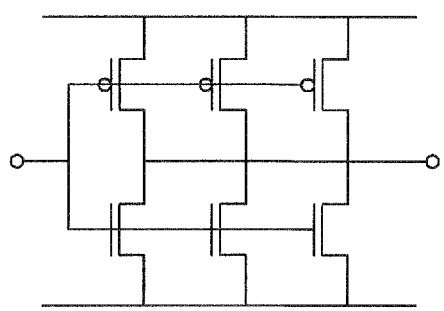
Figure 1G:
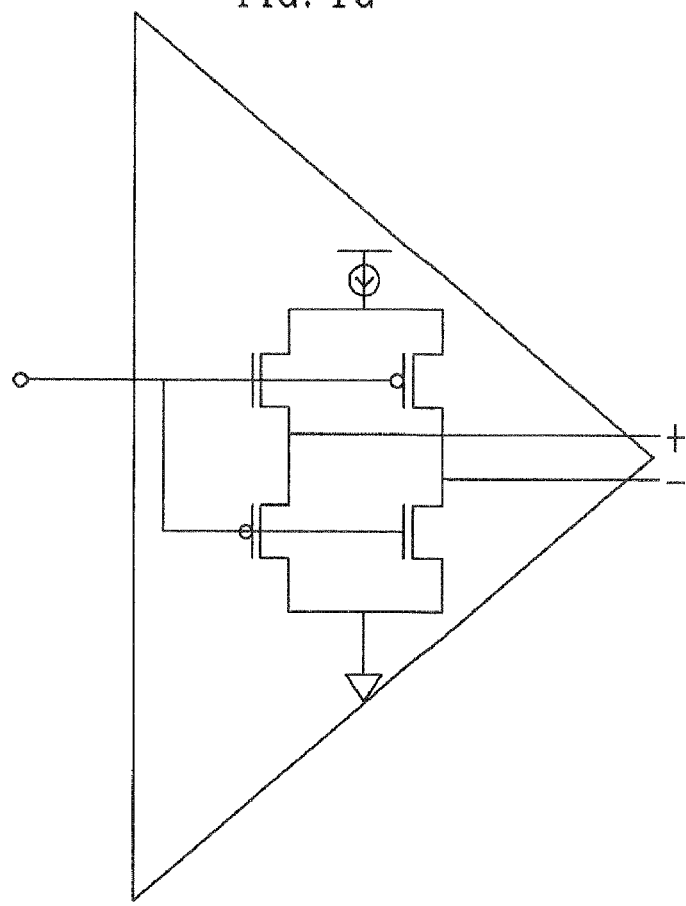

For example, FIG. 1A illustrates an inverter, FIG. 1B illustrates a NAND gate, FIGS. 1C and 1D illustrate a pull-up circuit and a pull-down circuit, respectively, FIG. 1E illustrates a buffer, and FIGS. 1F and 1G illustrate an output driver circuit. It is appreciated to those skilled in the art that the CMOS thin film transistor arrangement can be applied to various circuits other than the circuits illustrated in FIGS. 1A to 1G. That is, the CMOS thin film transistor arrangement can be provided in a driving circuit of a flat display such as an organic light emitting display device. Hereinafter, the CMOS thin film transistor arrangement according to the embodiment of the present invention will be described using the inverter of FIG. 1A as an illustrative example.

Figure 2:
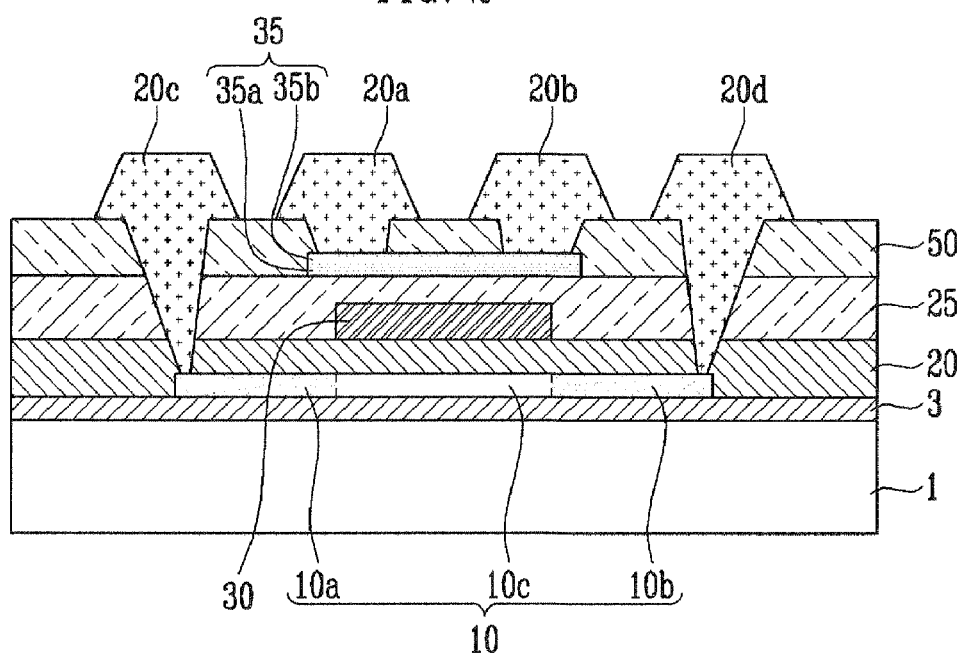
FIG. 2 is a cross-sectional view illustrating the CMOS thin film transistor arrangement according to an embodiment of the present invention.

Turning now to FIG. 2, FIG. 2 is a cross-sectional view illustrating the CMOS thin film transistor arrangement according to an embodiment of the present invention. Referring to FIG. 2, a buffer layer 3 is arranged on substrate 1 and a poly-silicon layer 10, used as an active layer of a first thin film transistor, is arranged on the buffer layer 3.

The poly-silicon layer 10 is produced by depositing and crystallizing an amorphous silicon layer. In the poly-silicon layer 10, a source region 10a and a drain region 10b are produced by an ion injection technique. By using an ion injection technique, the poly-silicon layer 10 is divided into the source region 10a, the drain region 10b, and a channel region 10c between the source region 10a and the drain region 10b. In this embodiment of the present invention, the source and drain regions 10a and 10b are produced by injecting P+ impurities such as phosphorus (P) or boron (B) ions with a gate electrode 30 being used as an ion implantation mask.

Then, a gate insulating layer 20 is arranged on the poly-silicon layer 10, and the gate electrode 30 is arranged on the gate insulating layer 20. The gate electrode 30 is positioned so that it overlaps the channel region 10c of the poly-silicon layer 10.

An intermediate insulating layer 25 is arranged on the entire surface of the gate electrode 30 and on exposed portions of the gate insulating layer 20, and an oxide semiconductor layer 35, used as an active layer of a second thin film transistor, is positioned so that it overlaps with the gate electrode 30.

The oxide semiconductor layer 35 is made out of GaInZnO (GIZO). The oxide semiconductor layer 35 is produced by doping the a zinc oxide (ZnO) host with gallium (Ga) and indium (In). In this case, the GIZO layer includes a lower layer 35a having a carrier concentration of $10^{15}$ to $10^{17}/cm^3$ and an upper layer 35b having a carrier concentration of $10^{12}$ to $10^{15}/cm^3$.

After formation of the oxide semiconductor layer 35, a passivation layer 50 is arranged on the upper side of the oxide semiconductor layer 35, and apertures (or via-holes) are arranged to perforate the passivation layer 50. Two of these apertures are arranged at locations that correspond to the source and drain regions 10a and 10b of the poly-silicon layer 10 and the other two apertures are arranged at locations that correspond to portions of the oxide semiconductor layer 35. Each of electrodes 20a, 20b, 20c and 20d are formed on the passivation layer 50 and extend through a corresponding one of the apertures in the passivation layer 50. Specifically, source and drain electrodes 20c and 20d (first source and drain electrodes) are electrically connected to the source and drain regions 10a and 10b of the poly-silicon layer 10 (the first thin film transistor) and source and drain electrodes 20a and 20b (second source and drain electrodes) are electrically connected to portions of the oxide semiconductor layer 35 (second thin film transistor). That is, the CMOS thin film transistor arrangement as illustrated in FIG. 2 is implemented as a laminated structure of the first thin film transistor and the second thin film transistor, and particularly such that the first thin film transistor and the second thin film transistor share a single gate electrode 30.

At this time, the first thin film transistor is a PMOS poly-silicon thin film transistor with a top gate configuration in which a P type poly-silicon layer 10 serves as the active layer, and the second thin film transistor is an NMOS oxide thin film transistor of an inverted staggered bottom gate configuration in which the oxide semiconductor layer 35 serves as the active layer. That is, the CMOS thin film transistor arrangement according to the embodiment of the present invention is configured by laminating the PMOS poly-silicon thin film transistor of a top gate configuration and the NMOS oxide thin film transistor of an inverted staggered bottom gate configuration having a common gate electrode 30 for both thin film transistors, so that the manufacturing process thereof can be simplified.

Furthermore, in the present invention, since the second thin film transistor is implemented as an oxide thin film transistor, many of the problems of a poly-silicon thin film transistor, such as non-uniformity of device characteristics such as threshold voltage are overcome. In addition, the oxide thin film transistor can be manufactured at low temperature, such as 350° C. or lower, using an existing processing apparatus without the need for additional processing apparatus such as an ion implanter. Also, since the first thin film transistor is implemented as a poly-silicon thin film transistor, high-speed switching can be achieved due to the high mobility of the poly-silicon material.

Consequently, the CMOS thin film transistor arrangement according to the embodiment of the present invention is manufactured by combining advantages of the oxide thin film transistor with the advantages of the poly-silicon thin film transistor. By doing so, performance and yield of the CMOS thin film transistor arrangement can be improved and manufacturing costs thereof can be also reduced.

Figure 3A:
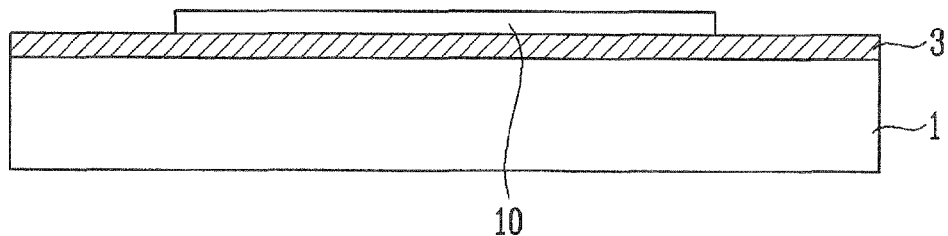
FIGS. 3A to 3E are cross-sectional views illustrating a process of manufacturing the CMOS thin film transistor arrangement of FIG. 2.

Turning now to FIGS. 3A to 3E, FIGS. 3A to 3E are cross-sectional views illustrating a manufacturing process of the CMOS thin film transistor arrangement in FIG. 2. Referring to FIG. 3A, the buffer layer 3 is first arranged on the substrate 1, and the poly-silicon layer 10, used as an active layer of the first thin film transistor, is arranged on the buffer layer 3.

The buffer layer 3 may be a silicon oxide layer, a silicon nitride layer, a silicon oxynitride layer or a multiple layer thereof. The poly-silicon layer 10 is produced by forming an amorphous silicon layer on the buffer layer 3, and then crystallizing the amorphous silicon layer by solid phase crystallization (SPC), excimer laser annealing (ELA), sequential lateral solidification (SLS) or metal induced crystallization (MIC).

Figure 3B:
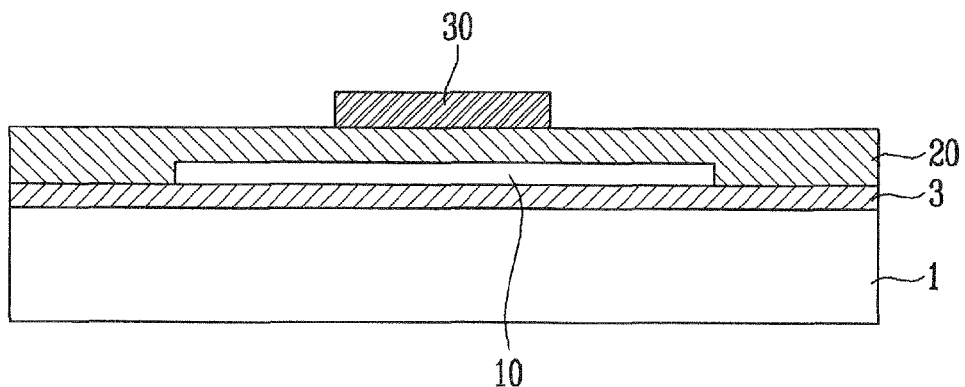

After formation of the poly-silicon layer 10, the gate insulating layer 20 is arranged on the poly-silicon layer 10, and the gate electrode 30 is arranged on the gate insulating layer 20 as illustrated in FIG. 3B. The gate insulating layer 20 may be a silicon oxide layer, a silicon nitride layer or a silicon oxynitride layer. Moreover, the gate insulating layer 20 may have a thickness of 500 to 1,500 Å by considering insulation resistance of the gate insulating layer as well as threshold voltage and charge mobility of the thin film transistor. Furthermore, the gate electrode 30 is positioned so that it overlaps with the channel region 10c at the center of the poly-silicon layer 10 so that left and right sides of the poly-silicon layer 10, as illustrated, are not covered by the gate electrode 30.

Figure 3C:
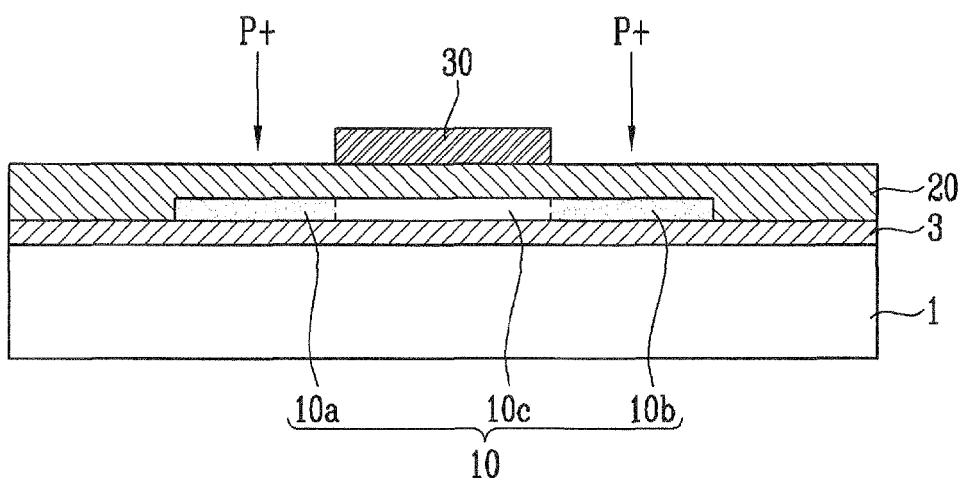

Next, as illustrated by FIG. 3C, the left and right sides of the poly-silicon layer 10 that are not covered by gate electrode 30 are doped by injecting P+ impurities, such as indium (In), boron (B) and the like, into these left and right sides of the poly-silicon layer 10 to produce the source and drain regions 10a and 10b by using the gate electrode 30 as an implantation mask. As a result, the channel region 10c located between the source and drain regions 10a and 10b does not receive the doping.

Figure 3D:
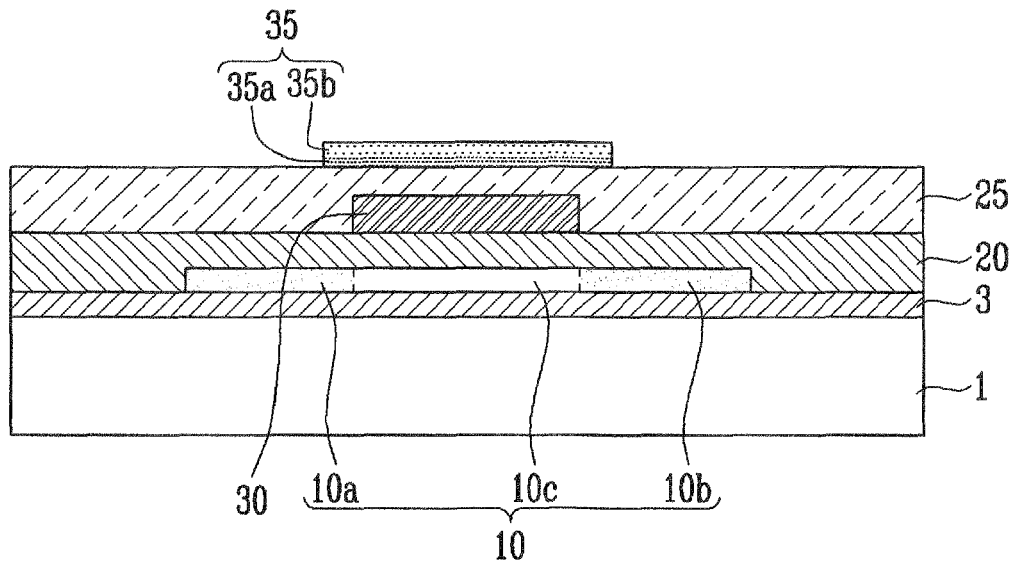

Referring now to FIG. 3D, the intermediate insulating layer 25 is arranged to cover entirely the gate electrode 30, and the oxide semiconductor layer 35, used as an active layer of the second thin film transistor, is arranged on a portion of the intermediate insulating layer 25 that overlaps the gate electrode 30. As illustrated in FIG. 3D, the oxide semiconductor layer 35 is wider than the gate electrode 30. Oxide semiconductor layer 35 is a GaInZnO (GIZO) layer produced by doping zinc oxide (ZnO) with gallium (Ga) and indium (In). This GIZO layer includes a lower layer 35a having a carrier concentration of $10^{15}$ to $10^{17}/cm^3$ and an upper layer 35b having a carrier concentration of about $10^{12}$ to $10^{15}/cm^3$.

Figure 3E:
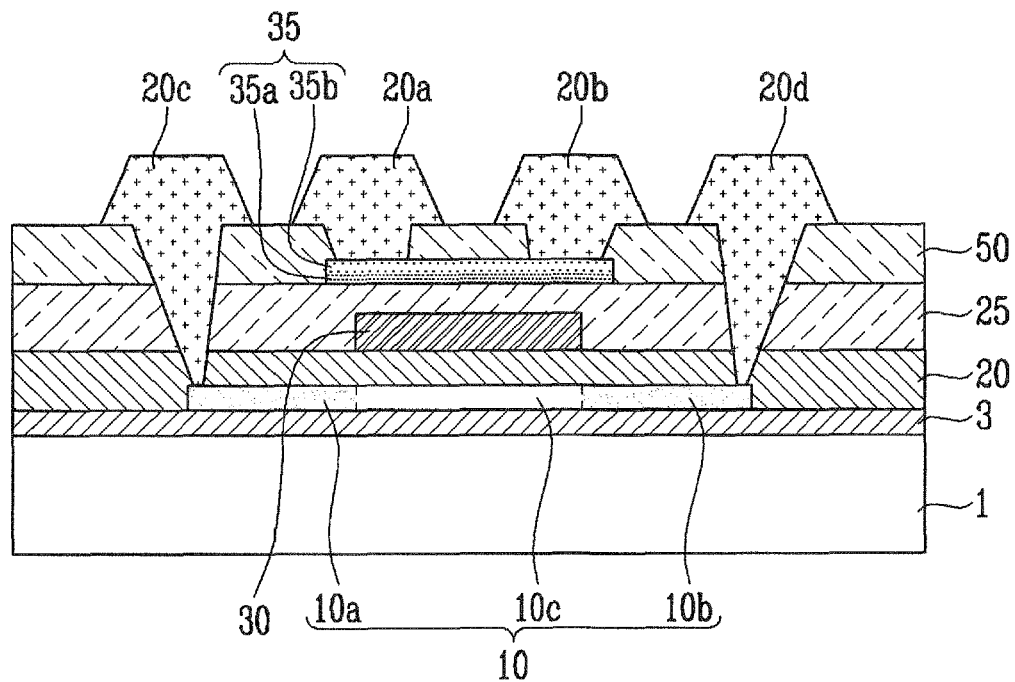

Referring now to FIG. 3E, the passivation layer 50 is arranged on the oxide semiconductor layer 35, and apertures (or via-holes) are formed in the passivation layer 50 to provide for electrical connection to both the poly-silicon layer 10 and the oxide semiconductor layer 35. Source and drain electrodes 20c and 20d, and 20a and 20b of the respective first and second thin film transistors are arranged on the passivation layer 50 and contact the source and drain regions 10a and 10b of the poly-silicon layer 10 of the first thin film transistor and portions of the oxide semiconductor layer 35 of the second thin film transistor, respectively.

As a result, the CMOS thin film transistor arrangement according to the embodiment of the present invention is manufactured to have a design in which a PMOS poly-silicon thin film transistor having a top gate configuration (the first thin film transistor) and an NMOS oxide thin film transistor having an inverted staggered bottom gate configuration (the second thin film transistor) are laminated. In addition, both the PMOS polysilicon thin film transistor and the NMOS oxide thin film transistor share a common gate electrode 30.

Figure 4A:
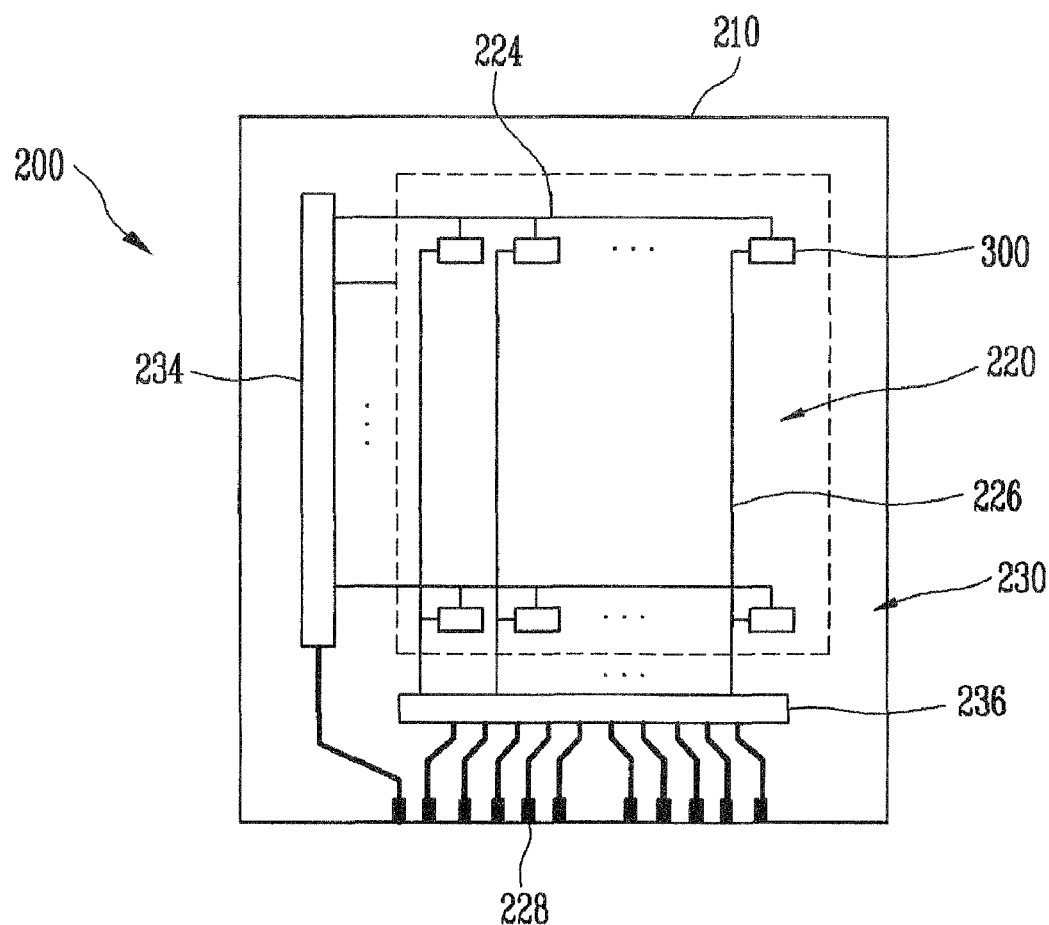
FIGS. 4A and 4B are a plan view and a cross-sectional view respectively of an organic light emitting display device according to an embodiment of the present invention.
Figure 4B:
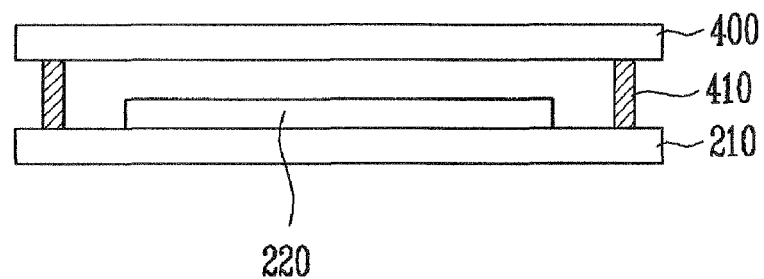

Turning now to FIGS. 4A and 4B, FIGS. 4A and 4B are a plan view and a cross-sectional view respectively of an organic light emitting display device according to an embodiment of the present invention. The organic light emitting display device will be used as an example of a flat panel display that includes the CMOS thin film transistor arrangement according to FIGS. 2 and 3 of the present invention.

Referring to FIG. 4A, a substrate 210 is defined by a pixel region 220 and non-pixel region 230 surrounding the pixel region 220. A plurality of pixels 300 connected to each other in matrix arrangement are arranged at intersections of scanning lines 224 and data lines 226 in the pixel region 220 and on the substrate 210. In the non-pixel region 230 of the substrate 210 are arranged the scanning lines 224 and the data lines 226 extended from the scanning lines 224 and the data lines 226 of the pixel region 220, a power feeding line (not shown) for driving respective pixels 300, a scan driving unit 234 and a data driving unit 236 for processing signals provided from the outside through a pad 228 and for providing the processed signal to the scanning lines 224 and the data lines 226.

In the organic light emitting display of FIGS. 4A and 4B, each of the pixels 300 include a pixel circuit having a plurality of thin film transistors and an organic light emitting device (OLED) connected to the pixel circuit. Each of the scan driving unit 234 and the data driving unit 236 also includes a circuit having a plurality of thin film transistors. Specifically, the scan driving unit 234 and/or the data driving unit 236 must include basic circuit devices such as the inverter and the buffer as illustrated in FIGS. 1A to 1G.

Turning now to FIG. 4B, above the substrate 210 in which the pixels 300 are arranged, an encapsulating substrate 400 for sealing the pixel region 220 is disposed and is bonded to the substrate 210 by a sealing member 410 so that the display 200 is completed.

As stated previously, the plurality of pixels 300, the scan driving unit 234, and the data driving unit 236, which are arranged on the substrate 210, include a plurality of thin film transistors. In the embodiment of the present invention, the devices, such as the inverter, the buffer, and the like, that are provided in the scan driving unit 234 and/or the data driving unit 236, are implemented as a CMOS thin film transistor arrangement according to the embodiment of the present invention as illustrated in FIGS. 2 and 3.

In the organic light emitting display device according to the embodiment of the present invention, the CMOS thin film transistor arrangement is implemented by the devices such as the inverter, the buffer, and the like, which are provided in the scan driving unit 234 and/or the data driving unit 236 using advantages of the above-described oxide thin film transistor and the poly-silicon thin film transistor. By doing so, performance and yield of the scan driving unit and/or the data driving unit are improved and manufacturing costs thereof can be reduced.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A CMOS thin film transistor arrangement, comprising:
 a substrate;
 a poly-silicon layer arranged on the substrate, the poly-silicon layer having source and drain regions separated by a channel region at a center portion of the poly-silicon layer, the poly-silicon layer being P-type;
 a gate insulating layer arranged on the poly-silicon layer;
 a gate electrode arranged on a portion of the gate insulating layer that corresponds to the channel region of the poly-silicon layer;
 an intermediate insulating layer arranged on the gate electrode and on the gate insulating layer;
 an oxide semiconductor layer arranged on a portion of the intermediate insulating layer that corresponds to the gate electrode;
 a passivation layer arranged on the oxide semiconductor layer to entirely cover the oxide semiconductor layer, the passivation layer being perforated by a plurality of apertures;
 first source and drain electrodes arranged on the passivation layer and contacting the source and drain regions respectively of the poly-silicon layer via ones of the apertures; and
 second source and drain electrodes arranged on the passivation layer and contacting portions of the oxide semiconductor layer via ones of said apertures.

2. The CMOS thin film transistor arrangement of claim 1, further comprising a PMOS poly-silicon thin film transistor with a top gate configuration, wherein the PMOS poly-silicon thin film transistor comprises:
 the poly-silicon layer;
 the gate electrode; and
 the first source and drain electrodes.

3. The CMOS thin film transistor arrangement of claim 1, further comprising a NMOS oxide thin film transistor having an inverted staggered bottom gate configuration, wherein the NMOS oxide thin film transistor comprises:
 the gate electrode;
 the oxide semiconductor layer; and
 the second source and drain electrodes.

4. The CMOS thin film transistor arrangement of claim 3, wherein the oxide semiconductor layer comprises GaInZnO (GIZO), the oxide semiconductor layer being produced by doping zinc oxide (ZnO) with gallium (Ga) and indium (In).

5. The CMOS thin film transistor arrangement of claim 4, wherein the oxide semiconductor layer comprises:
 a lower layer having a carrier concentration of $10^{15}$ to $10^{17}/cm^3$; and
 an upper layer having a carrier concentration of $10^{12}$ to $10^{15}/cm^3$.

6. A method of manufacturing a CMOS thin film transistor arrangement, comprising:
 forming a buffer layer on a substrate;
 forming a poly-silicon layer on the buffer layer, the poly-silicon layer being an active layer of a first thin film transistor;
 forming a gate insulating layer on the poly-silicon layer;
 forming a gate electrode on the gate insulating layer;

producing a source region, a drain region and a channel region of the first thin film transistor in the poly-silicon layer by injecting P+ impurities into portions of the poly-silicon layer that are not covered by the gate electrode, the gate electrode serving as a mask during said injecting;

forming an intermediate insulating layer on an entire surface of the gate electrode and on exposed portions of the gate insulating layer;

forming an oxide semiconductor layer on a portion of the intermediate insulating layer that overlaps the gate electrode, the oxide semiconductor layer being an active layer of a second thin film transistor;

forming a passivation layer on the oxide semiconductor layer, the passivation layer being perforated by a plurality of apertures; and forming first source and drain electrodes and second source and drain electrodes on the passivation layer and in the apertures in the passivation layer, the first source and drain electrodes being in contact with the source and drain regions respectively of the poly-silicon layer and the second source and drain electrodes being in contact with portions of the oxide semiconductor layer.

7. The method of claim 6, wherein the first thin film transistor is a PMOS poly-silicon thin film transistor having a top gate configuration.

8. The method of claim 6, wherein the second thin film transistor is an NMOS oxide thin film transistor having an inverted staggered bottom gate configuration.

9. An organic light emitting display device, comprising: a plurality of data lines intersecting a plurality of scanning lines; a plurality of pixels, each of said pixels being arranged at an intersection of one of said data lines and one of said scanning lines, each of said pixels including a plurality of thin film transistors and an organic light emitting device; a scan driving unit including a plurality of thin film transistors, the scan driving unit to supply scanning signals to the plurality of scanning lines; and a data driving unit including a plurality of thin film transistors, the data driving unit to supply data signals to the plurality of data lines, wherein the plurality of thin film transistors in the scan driving unit and in the data driving unit each include a CMOS thin film transistor arrangement, each CMOS thin film transistor arrangement comprises: a substrate; a poly-silicon layer arranged on the substrate, the poly-silicon layer having source and drain regions separated by a channel region at a center portion of the poly-silicon layer, the poly-silicon layer being P-type; a gate insulating layer arranged on the poly-silicon layer; a gate electrode arranged on a portion of the gate insulating layer that corresponds to the channel region of the poly-silicon layer; an intermediate insulating layer arranged on the gate electrode and on the gate insulating layer; an oxide semiconductor layer arranged on a portion of the intermediate insulating layer that corresponds to the gate electrode; a passivation layer arranged on the oxide semiconductor layer to entirely cover the oxide semiconductor layer, the passivation layer being perforated by a plurality of apertures; first source and drain electrodes arranged on the passivation layer and contacting the source and drain regions respectively of the poly-silicon layer via ones of the apertures; and second source and drain electrodes arranged on the passivation layer and contacting portions of the oxide semiconductor layer via ones of said apertures.

10. The organic light emitting display device of claim 9, wherein the CMOS thin film transistor arrangement is one of an inverter and a buffer device for at least one of the scan driving unit and the data driving unit.

\* \* \* \* \*